United States Patent [19]

Kono et al.

[11] Patent Number: 4,949,033
[45] Date of Patent: Aug. 14, 1990

[54] LSI SYSTEM INCLUDING A PLURALITY OF LSI CIRCUIT CHIPS MOUNTED ON A BOARD

[75] Inventors: Takeshi Kono; Tatsuro Yoshimura, both of Kawasaki, Japan

[73] Assignee: Fujitsu Limited, Kawasaki, Japan

[21] Appl. No.: 354,364

[22] Filed: May 19, 1989

[30] Foreign Application Priority Data

May 19, 1988 [JP] Japan ................. 63-123405

[51] Int. Cl.$^5$ .............................. G01R 31/28
[52] U.S. Cl. ......................... 324/158 R; 371/22.5
[58] Field of Search ............ 324/73 R, 73 AT, 158 R, 324/73 PC, 158 F; 371/15, 20, 25, 22.5

[56] References Cited

U.S. PATENT DOCUMENTS 4,748,403  5/1989  Tamamura ..................... 324/73 R

FOREIGN PATENT DOCUMENTS 0066086   12/1982  European Pat. Off. ........ 324/158 R
53-125771 11/1978  Japan .
66-73075   4/1986  Japan .
63-133072  6/1988  Japan .

Primary Examiner—Reinhard J. Eisenzopf
Assistant Examiner—Edward Urban
Attorney, Agent, or Firm—Staas & Halsey

[57] ABSTRACT

An LSI system includes; a multi-layer print board; and a plurality of LSI circuit chips mounted on the multi-layer printed circuit board, each including a plurality of pins, a reference voltage terminal, a pin scan out terminal and a plurality of pin scan out circuits corresponding to the pins on a one-to-one basis. The multi-layer printed circuit board includes a reference voltage feeding layer formed therein in a form of a mesh or a sheet, at least one further layer overlying the reference voltage feeding layer and a plurality of through holes extending through each such further layer. By electrically connecting each reference voltage terminal of the plurality of LSI circuit chips through a corresponding through hole to the reference voltage feeding layer, a substantially equal reference voltage can be fed to each LSI and the voltage drop thereof is reduced.

2 Claims, 5 Drawing Sheets

LSI SYSTEM INCLUDING A PLURALITY OF LSI CIRCUIT CHIPS MOUNTED ON A BOARD

BACKGROUND OF THE INVENTION

1. Field of the Invention

The present invention relates to a large scale integration (LSI) system including a plurality of LSI circuit chips mounted on a board. More particularly, it relates to an LSI system adapted to measuring a voltage appearing at each pin of the chips using a non-contact approach to test the LSI system.

Note, in the following description, the term "LSI" indicates a semiconductor chip including a plurality of LSI circuits and a package accommodating the chip, as long as a specific definition is not added thereto. Also, a voltage appearing at each pin of the LSI is hereinafter referred to as an LSI pin voltage.

2. Description of the Related Art

A test of an LSI system is classified into a function test and a net test. The function test is carried out by applying input signals via a conductor on a board to LSIs mounted on the board and examining whether or not expected values corresponding to the input signals are obtained from output terminals of each LSI. On the other hand, the net test is carried out by measuring voltages appearing on wiring connecting input/output terminals (pins) between each LSI and examining whether or not each voltage drop corresponding to the measured voltages is within a permissible range. In any case, the test of the LSI system is carried out by detecting LSI pin voltages. Namely, in the function test, a judgement of logic "1" or "0" is made in accordance with whether or not the LSI pin voltage is higher than a certain reference voltage, and a judgement is further made of whether or not this logic coincides with the expected value. On the other hand, in the net test, the value of the voltage drop is obtained by measuring voltages at both ends of the wiring connecting input/output pins between each LSI and detecting a voltage difference therebetween.

For example, assuming that a voltage of $-0.9$ V indicates "1" and a voltage of $-1.7$ V indicates "0", a voltage of $-1.3$ V is selected as the reference voltage in the function test. On the other hand, in the net test, a judgement is made of whether or not the voltage of $-0.9$ V is finally lowered to a voltage of $-1.1$ V. Namely, the net test is carried out with a margin of 200 mV on the "H" level side. Accordingly, for example, an advantage is gained in that it is possible to exclude an LSI system in which the voltage level fluctuates around a voltage of $-1.3$ V due to noise inevitably occurring in real operation and in which an erroneous operation may be carried out, although the LSI system is considered to be "good" at a voltage higher than $-1.3$ V in the function test.

Namely, to reliably carry out such a net test, the LSI pin voltage must be accurately detected. In connection with this, the reference voltage must be stably fed to each LSI with a constant and equal value. In a known technique, however, an LSI system satisfactorily meeting these requirements has not been proposed.

SUMMARY OF THE INVENTION

An object of the present invention is to provide an LSI system adapted to feed a substantially equal reference voltage to each LSI in the measurement of LSI pin voltages using a non-contact approach, while reducing a voltage drop of the reference voltage.

The above object is attained by providing an LSI system including: a multi-layer printed circuit board; and a plurality of LSIs (LSI circuit chips) mounted on the multi-layer printed circuit board, each including a plurality of pins, a reference voltage terminal, a pin scan out terminal and a plurality of pin scan out circuits corresponding to the pins on a one-to-one basis, each of the plurality of pin scan out circuits comparing a pin voltage appearing at a corresponding pin with a reference voltage appearing at the reference voltage terminal and outputting a signal indicating a result of the comparison in response to a pin select signal, the signal output from each pin scan out circuit being transmitted to the pin scan out terminal in a selection state of the corresponding LSI, the multi-layer printed circuit board including a reference voltage feeding layer formed therein in a form of a mesh or a sheet, and each reference voltage terminal of the plurality of LSIs being electrically connected via a corresponding through hole to the reference voltage feeding layer.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

For a better understanding of the preferred embodiment according to the present invention, the problems in the prior art will be explained with reference to FIGS. 1 to 4.

Figure 1:
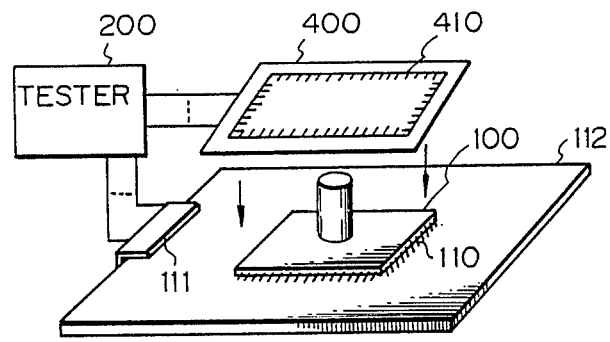
FIG. 1 is a view for explaining an example of the prior art approach to measuring an LSI pin voltage.

FIG. 1 illustrates an example of the prior art approach of measuring an LSI pin voltage.

In FIG. 1, reference 100 denotes an LSI; reference 110 a pin; reference 111 a connector; reference 112 a board; reference 200 a tester; reference 400 a probe card; and reference 410 a probe. The test according to this approach is carried out by directly contacting a plurality of probes 410 to a corresponding plurality of pins 110 projecting from each LSI 100 in the LSI system, inputting test patterns via a connector 111 of a board 112 or via probes 410 of a probe card 400 to the LSI 100, measuring terminal voltages appearing at each pin 110 by way of the probes 410 at the tester 200, and comparing the measured voltages with expected values under a test condition stored in advance in the tester 200, or detecting the voltage values.

Although the approach shown in FIG. 1 has an advantage of high accuracy measurement, it adversely poses the following problems: first, a probing arrangement needs to be provided separately from the LSI system; second, where the pins are hidden between the LSI package and the board, probing is impossible; third, probing is difficult due to a thick density in the mounting, a fine fabrication of the LSI pins and a fine fabrication of probing pads provided on the board.

Figure 2:
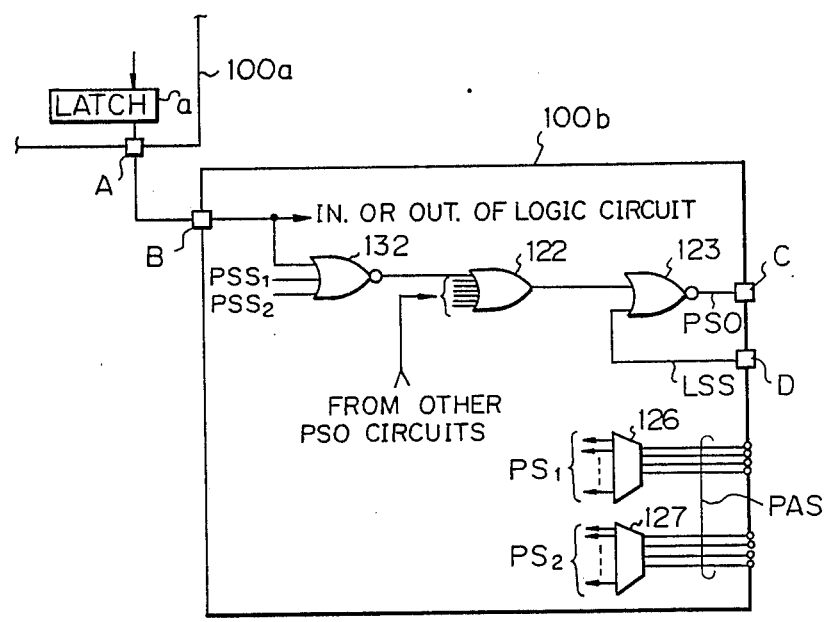
FIG. 2 is a view for explaining another example of the prior art approach to measuring an LSI pin voltage.

FIG. 2 illustrates another example of the prior art approach of measuring an LSI pin voltage.

In FIG. 2, references 100a and 100b denote LSIs; reference 122 an OR gate; reference 123 an NOR gate; references 126 and 127 decoders; reference 132 an NOR gate; reference a a latch; references A and B LSI pins; and references C and D terminals. In the constitution shown in FIG. 2, the decoders 126 and 127 have the function of decoding a pin address signal PAS from an external source and outputting a pin select signal $PS_1$, $PS_2$. When the logic "1" or "0" is written in the latch a of the LSI 100a, a voltage corresponding to the logic "1" or "0" is applied via the LSI pins A and B to a first input of the NOR gate 132. In this case, a pin select signal $PSS_1$ of one of the output lines of the decoder 126 is applied to a second input of the NOR gate 132 and a pin select signal $PSS_2$ of one of the output lines of the decoder 127 is applied to a third input of the NOR gate 132. When the pin select signals $PSS_1$ and $PSS_2$ are in a logic "0" state, the logic value appearing at the LSI pin B is inverted by the NOR gate 132 and output therefrom. The output of the NOR gate 132 is applied via the OR gate 122 to a first input of the NOR gate 123. The second input of the NOR gate 123 receives an external LSI select signal LSS via the terminal D. When the LSI select signal LSS is in a logic "0" state, the logic value appearing at the first input of the NOR gate 123 is inverted by the NOR gate 123 and output therefrom. The output of the NOR gate 123 is output as a pin scan out (PSO) signal PSO via the terminal C to the external.

Although the approach shown in FIG. 2 has advantages of a non-contact test without a need for probing, and freedom fromm physical test restrictions such as sizes and positions of LSI pins, it adversely poses the problem that since the LSI pin voltages are taken out via the gates by the tester outside the LSI, it is difficult to reliably measure the pin voltage due to voltage drops occurring along the way.

Figure 3:
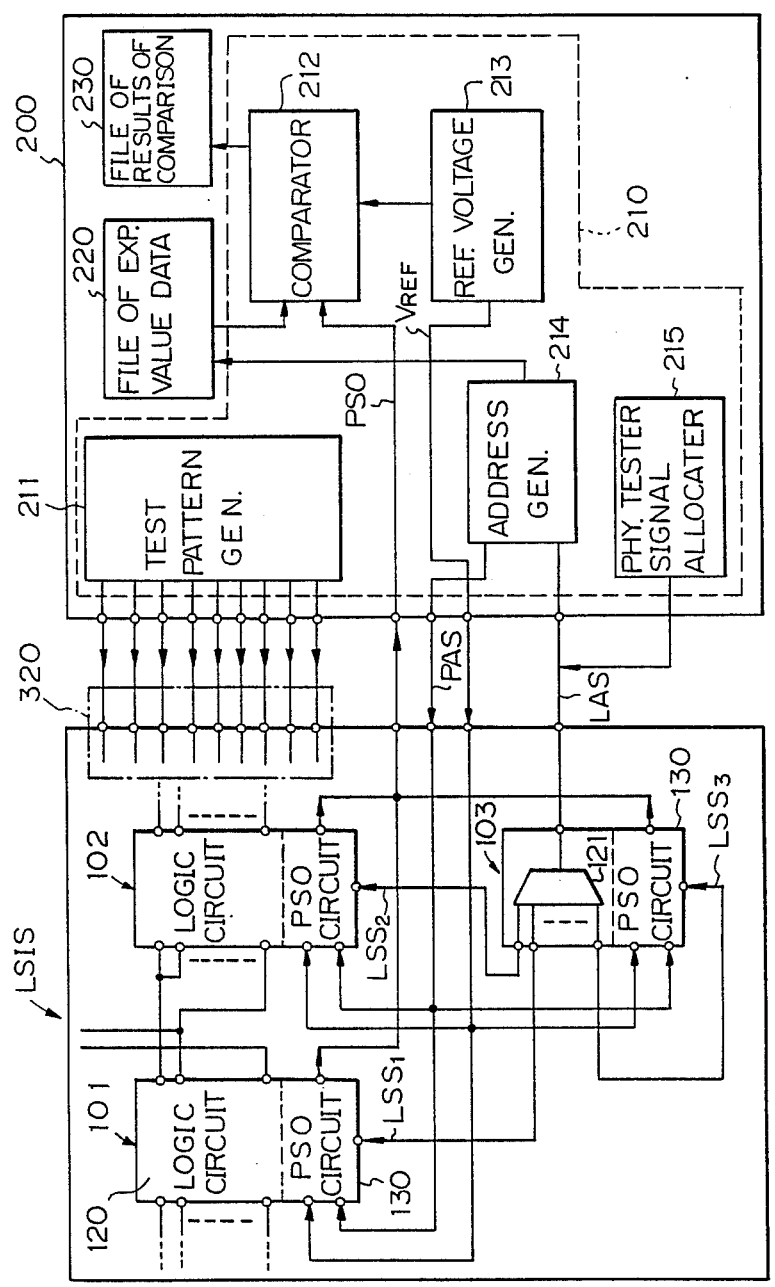
FIG. 3 is a block diagram illustrating an entire constitution of the test system including the LSI system according to the present invention.

To cope with this, the present inventors previously proposed a circuit constitution shown in FIG. 3.

FIG. 3 illustrates the entire constitution of the test system including the LSI system. In FIG. 3, references 101 to 103 denote LSIs; reference 120 a logic circuit portion; reference 121 a decoder; reference 130 a PSO circuit portion; reference 200 a tester; reference 210 a control portion; reference 211 a test pattern generator; reference 212 a comparator; reference 213 a reference voltage generator; reference 214 an address generator; reference 215 a physical tester signal allocator; reference 220 a file of expected value data; reference 230 a file of results of comparison; reference 320 a connector; and reference LSIS an LSI system.

The LSI system LSIS is constituted by a printed circuit board (not shown) and a plurality of LSIs 101, 102, 103 disposed on the printed circuit board. Each LSI includes the logic circuit portion 120 and the PSO circuit portion 130. The PSO circuit portion 130 compares a selected LSI pin voltage with a reference voltage and outputs a result based on the comparison. The decoder 121 decodes an LSI address signal LAS, and each output signal $LSS_1$, $LSS_2$, $LSS_3$ thereof is applied to each select terminal of a corresponding PSO circuit portion 130. The tester 200 includes the control portion 210, the file 220 of expected value data and the file 230 of results of comparison, and the control portion 210 is constituted by the test pattern generator 211, the comparator 212, the reference voltage generator 213, the address generator 214 and the physical tester signal allocator 215.

The test pattern generator 211 is a circuit for generating test patterns to be applied to the LSI system LSIS. The comparator 212 has the function of receiving the expected value data from the file 220, the reference voltage from the reference voltage generator 213 and the PSO signal PSO from each LSI, and comparing the reference voltage at the inversion of the level of the PSO signal with the expected value data. The result based on the comparison is stored in the file 230. The reference voltage generator 213 is a circuit for generating a variable reference voltage. For example, the variable reference voltage is increased step by step. The address generator 214 is a circuit for generating the LSI address signal LAS and a pin address signal PAS. The LSI address signal LAS is for designating an LSI to be scanned out, while the pin address signal PAS is for designating an LSI pin to be scanned out. For example, assuming that the LSI address signal LAS designates the LSI 101 and the pin address signal PAS designates the first pin thereof, the result PSO of the comparison between the first LSI pin voltage of the LSI 101 and the reference voltage $V_{REF}$ is input to the comparator 212. The physical tester signal allocater 215 is a circuit for setting a location corresponding to the pin arrangement in the LSI system LSIS to be tested. Also, voltage value data of each LSI pin in the case that test patterns are applied to the LSI system LSIS is stored in advance in the file 220, and is classified for each of the test patterns. The file 230 stores the results obtained by the comparator 212.

Figure 4:
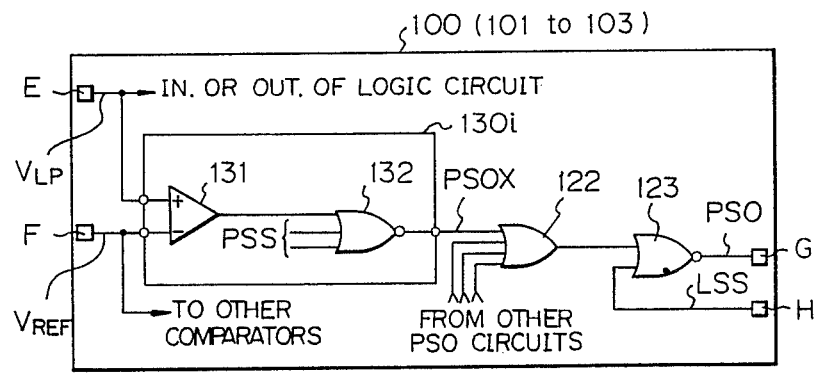
FIG. 4 is a circuit diagram illustrating a constitution of main parts of the LSI shown in FIG. 3.

FIG. 4 illustrates a constitution of the main parts of each of LSIs 101, 102 and 103 shown in FIG. 3. In FIG. 4, reference 100 (101 to 103) denotes one such LSI; reference 122 an OR gate; reference 123 a NOR gate; reference 130i a PSO circuit; reference 131 a comparator; reference E an LSI pin; reference F a reference voltage terminal; reference G a PSO terminal; and reference H an LSI select signal input terminal, respectively.

The PSO circuit 130i is provided for the corresponding LSI pin E on a one-to-one basis. Namely, where the number of the PSO circuits 130i included in each LSI is n, the corresponding number n of LSI pins E is provided in each LSI. Each PSO circuit 130i is constituted by the comparator 131 and the NOR gate 132. The comparator 131 receives an LSI pin voltage $V_{LP}$ input via the corresponding LSI pin E and the reference voltage $V_{REF}$ input via the terminal F. The comparator 131 outputs a "0" signal when the LSI pin voltage is lower than the reference voltage, while it outputs a "1" signal when the former is higher than the latter. The output of the comparator 131 is applied to a first input of the NOR gate 132 and the pin select signals PSS ($PSS_1$, $PSS_2$) are applied to a second and third inputs thereof, respectively. The output PSOX of the NOR gate 132 is applied to one input end of the OR gate 122 and the outputs from other PSO circuits are applied to other input ends thereof. The output of the OR gate 122 is applied to one input end of the NOR gate. Another input end of the NOR gate 123 receives the LSI select signal LSS via the terminal H from the external. The output PSO of the NOR gate 123 is output externally via the terminal G to the external.

Next, the operation of the LSI system will be explained with reference to FIGS. 3 and 4.

The LSI address signal LAS generated from the address generator 214 is decoded by the decoder 121, which selects the LSI to be scanned out. Also, the pin address signal PAS generated from the address generator 214 is decoded by the decoders in the PSO circuit 130 (see FIG. 2, decoders 126, 127), which select the LSI pins to be tested. Assuming that the LSI address signal LAS designates the LSI 101 and the pin address signal PAS designates the first pin thereof, the result of the comparison between the first LSI pin voltage of the LSI 101 and the reference voltage $V_{REF}$ is input to the comparator 212.

On the other hand, the test patterns generated from the test pattern generator 211 are applied via the connector 320 to the LSI system LSIS. The first LSI pin voltage of the LSI 101 is input to the comparator 131 (see FIG. 4) of a first PSO circuit $130_1$ connected to the corresponding first LSI pin E of the LSI 101. The reference voltage $V_{REF}$ generated from the reference voltage generator 213 is also input to the comparator 131 of the first PSO circuit $130_1$. The comparator 131 compares a first LSI pin voltage $V_{LP}$ generated by the application of the test patterns with the reference voltage $V_{REF}$. If the first LSI pin voltage is higher than the reference voltage, the first PSO circuit 103, outputs an "L" level signal PSOX.

As explained before, the reference voltage generator 213 increases the reference voltage step by step. When the reference voltage coincides with the first LSI pin voltage at a certain time, the output signal PSOX of the first PSO circuit $130_1$ is inverted from "L" level to "H" level. In this case, since the LSI 101 is designated and the LSI selected signal LSS is in logic "0", the pin scan out (PSO) signal PSO is inverted from "H" level to "L" level. The comparator 212 detects the inversion of the level of the PSO signal, compares the expected value data read from the file 220 with the reference voltage at the coincidence, and stores the result based on the comparison in the file 230.

According to the constitution of FIGS. 3 and 4, since the comparator 131 is included in the PSO circuit 130i and the LSI pin voltage is compared with the reference voltage before its voltage drop occurs, it is possible to detect the voltage level more accurately than the cases in FIGS. 1 and 2.

However, a problem arises when the reference voltage is fed from the tester 200 to each LSI 101, 102, 103 of the LSI system LSIS. Namely, since each length of the wiring connecting each LSI and the connector terminals of the board is different, a voltage difference occurs between the reference voltages applied to each comparator of the PSO circuits. As a result, a problem occurs in that it is difficult to reliably detect the LSI pin voltage due to the voltage difference occurring between each LSI and the connector terminals of the board.

Figure 5A:
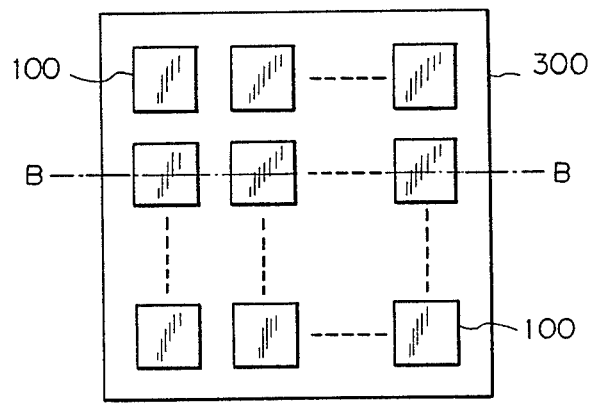
FIGS. 5A and 5B are views schematically illustrating a constitution of the LSI system according to the present invention.
Figure 5B:
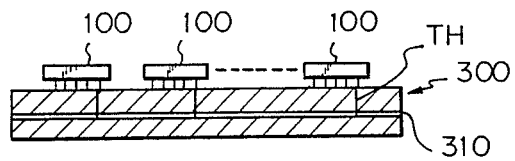

FIGS. 5A and 5B schematically illustrate a constitution of the LSI system according to the present invention. FIG. 5A is a plan view and FIG. 5B is a sectional view in a plane along the line B—B in FIG. 5A.

The illustrated LSI system comprises a multi-layer print board 300 and a plurality of LSIs 100 mounted on the multi-layer print board. The constitution of each LSI 100 is the same as that shown in FIG. 4, and accordingly, the explanation thereof is omitted. Reference 310 denotes a reference voltage feeding layer, which is in the form of a mesh or a sheet within the multi-layer print board 300. Also, reference TH denotes a through hole for electrically connecting the reference voltage terminal F of the corresponding LSI 100 to the reference voltage feeding layer 310.

Thus, each length of the wiring connecting each LSI 100 and the reference voltage feeding layer 310 is defined by each through hole TH having a substantially equal length (depth). As a result, it is possible to greatly reduce a voltage difference between each reference voltage applied to the LSIs 100, and accordingly, to feed a substantially equal reference voltage to each LSI in the measurement of LSI pin voltages by a non-contact approach. Also, since the length of the through hole TH substantially corresponds to only the combined thickness of the layers overlying the reference voltage feeding layer 310, it is possible to greatly decrease the voltage drop of the reference voltage, as compared with the prior art. These advantages contribute to high accuracy measurement.

Figure 6:
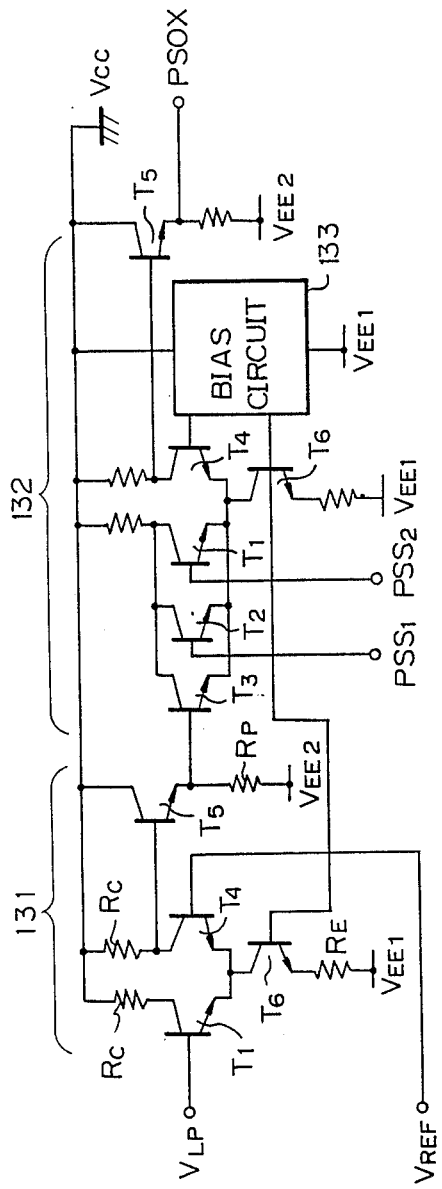
FIG. 6 is a circuit diagram illustrating a concrete constitution of the PSO circuit shown in FIG. 4.

FIG. 6 illustrates a concrete circuit constitution of the PSO circuit 130i shown in FIG. 4.

In FIG. 6, references T1 to T6 denote NPN type transistors; references Rc, Rp and $R_E$ resistors; and reference 133 a bias circuit. The transistors T1 to T6 shown in the right side constitute the NOR gate 132 and the transistors T1, T4, T5 and T6 shown in the left side constitute the comparator 131. The comparator 131 and NOR gate 132 are constituted by an emitter coupled logic (ECL) gate, respectively. The ECL gate has a NOR/OR logic.

In the comparator 131, a base of the transistor T1 receives the LSI pin voltage $V_{LP}$ and a base of the transistor T4 receives the reference voltage $V_{REF}$. A collector of the transistor T4 is connected to a base of the transistor T5. A base of the transistor T6 receives an output of the bias circuit 133.

On the other hand, in the NOR gate 132, a base of the transistor T3 receives the emitter voltage of the transistor T5 of the comparator 131. A base of the transistor T2 receives the pin select signal $PSS_1$ and a base of the transistor T1 receives the pin select signal $PSS_2$. A base of the transistor T4 receives an output of the bias circuit 133 and a base of the transistor T6 receives another output of the bias circuit 133. Also, a collector of the transistor T4 is connected to a base of the transistor T5. The emitter voltage of the transistor T5 of the NOR gate 132 provides the output PSOX of the PSO circuit 130i.

Figure 7:
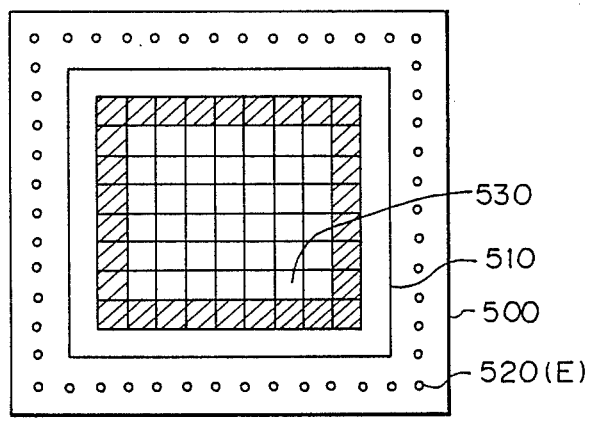
FIG. 7 is a plan view showing an arrangement of comparators in the LSI.

FIG. 7 is a plan view for explaining an arrangement of comparators in the LSI. In FIG. 7, reference 500 denotes an LSI package; reference 510 a chip; reference 520(E) an LSI pin; and reference 530 an ECL gate cell, respectively.

The comparator see FIG. 4) 131 employed in each PSO circuit 130i of the LSI 100 (101 to 103) is constituted by a specific portion of ECL gate cells 530. In the present embodiment, the specific portion is selected in the vicinity of the LSI pin 520(E), as shown in FIG. 7 by the hatched portion. This selection contributes to a reduction in the voltage drop of the LSI pin voltage.

Finally, the net test using the LSI system according to the present invention will be explained with reference to FIG. 8.

Figure 8:
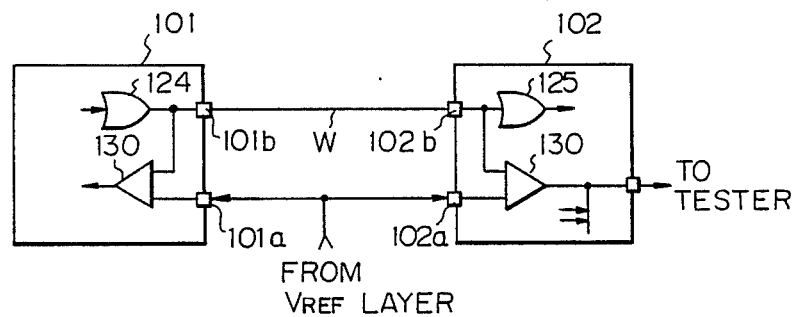
FIG. 8 is a view for explaining the net test using the LSI system according to the present invention.

In FIG. 8, references 101, 102 denote LSIs; references 101a, 101b, 102a, 102b LSI pins; references 124, 125 gates; reference 130 the PSO circuit; and W wiring on the board, respectively. The LSI pins 101a, 102a are connected to the reference voltage feeding layer.

To carry out the net test, first, the LSI 101 is brought to an output state of logic "1" or "0" via the gate 124. This data is input via the LSI pin 101b, the wiring W and the LSI pin 102b to the LSI 102, and applied to the gate 125 and the PSO circuit 130. The PSO circuit 130 compares the LSI pin voltage with the reference voltage and outputs a result of the comparison to the tester. On the other hand, in the LSI 101 as well, the PSO circuit 130 compares the output of the gate 124 with the reference voltage. Assuming that the reference voltage changes within the range of −2 V to −0.5 V and the voltages appearing at the LSI pins 101a, 102a are −0.9 V, −1.2 V, respectively, the voltage difference between the LSI pins 101a, 102a is 300 mV. In this case, a judgement is made that the LSI may be at an "OPEN" state. Also, in the measurement of the voltage appearing at the LSI pin 102a, where the reference voltage is changed within the range of −2 V to −0.5 V and the output of the PSO circuit 130 is not inverted, a judgement is made that the LSI pin 102a may be short-circuited to the reference voltage feeding layer.

Although the present invention has been disclosed and described by way of one embodiment, it is apparent to those skilled in the art that other embodiments and modifications of the present invention are possible without departing from the spirit or essential features thereof.

We claim:
1. An LSI system comprising:
a multi-layer printed circuit board; and
a plurality of LSI circuit chips mounted on said multi-layer printed circuit board, each including a plurality of pins, a reference voltage terminal, a pin scan out terminal and a plurality of pin scan out circuits corresponding to said pins on a one-to-one basis, each of said plurality of pin scan out circuits comparing a pin voltage appearing at a corresponding pin with a reference voltage appearing at said reference voltage terminal and outputting a signal indicating the result of said comparing in response to a pin select signal, said signal output from each pin scan out circuit being transmitted to said pin scan out terminal in a selection state of the corresponding LSI circuit chip,
said multi-layer printed circuit board including a reference voltage feeding layer formed therein in a form of a mesh or a sheet, at least one further layer overlying the reference voltage feeding layer and a plurality of through holes extending through each such further layer, and each reference voltage terminal of said plurality of LSI circuit chips being electrically connected via a corresponding through hole to said reference voltage feeding layer.

2. An LSI system as set forth in claim 1, wherein each of said plurality of pin scan out circuits includes a comparator responding to said pin voltage and said reference voltage, each comparator of said plurality of pin scan out circuits being constituted by a specific portion of emitter coupled logic gate cells arrayed on a semiconductor chip, said specific portion being selected in the vicinity of said plurality of pins.

* * * * *

UNITED STATES PATENT AND TRADEMARK OFFICE
CERTIFICATE OF CORRECTION

PATENT NO. : 4,949,033

DATED : Aug. 14, 1990

INVENTOR(S) : KONO et al.

It is certified that error appears in the above-identified patent and that said Letters Patent is hereby corrected as shown below:

FRONT PAGE:

[56] References Cited: change "5/1989" to --5/1988--;

FOREIGN PATENT DOCUMENTS: change "66-73075" (third document) to --61-73075--;

[57] ABSTRACT: line 1, delete ";" (both occurrences).

Col. 3, line 22, change "," to --.--;
line 44, change "fromm" to --from--.

Col. 5, line 34, change "103," to --$130_1$--.

Col. 6, line 64, before "see" insert --(--.

Signed and Sealed this

Twenty-eighth Day of April, 1992

Attest:

HARRY F. MANBECK, JR.

Attesting Officer     Commissioner of Patents and Trademarks